US009763008B2

(12) United States Patent
Johnson et al.

(10) Patent No.: US 9,763,008 B2
(45) Date of Patent: Sep. 12, 2017

(54) TIMBRE CONSTANCY ACROSS A RANGE OF DIRECTIVITIES FOR A LOUDSPEAKER

(71) Applicant: Apple Inc., Cupertino, CA (US)

(72) Inventors: Martin E. Johnson, Los Gatos, CA (US); Tomlinson Holman, Yucca Valley, CA (US)

(73) Assignee: APPLE INC., Cupertino, CA (US)

( * ) Notice: Subject to any disclaimer, the term of this patent is extended or adjusted under 35 U.S.C. 154(b) by 12 days.

(21) Appl. No.: 14/773,256

(22) PCT Filed: Mar. 6, 2014

(86) PCT No.: PCT/US2014/021433

§ 371 (c)(1),
(2) Date: Sep. 4, 2015

(87) PCT Pub. No.: WO2014/164234

PCT Pub. Date: Oct. 9, 2014

(65) Prior Publication Data

US 2016/0021458 A1 Jan. 21, 2016

Related U.S. Application Data

(60) Provisional application No. 61/776,648, filed on Mar. 11, 2013.

(51) Int. Cl.
*H03G 5/00* (2006.01)
*H04R 5/04* (2006.01)
(Continued)

(52) U.S. Cl.
CPC ............... *H04R 5/04* (2013.01); *H04R 1/403* (2013.01); *H04R 5/02* (2013.01); *H04R 29/002* (2013.01);
(Continued)

(58) Field of Classification Search
CPC combination set(s) only.
See application file for complete search history.

(56) References Cited

U.S. PATENT DOCUMENTS 5,233,664 A * 8/1993 Yanagawa .............. H04R 1/403 381/182
5,870,484 A * 2/1999 Greenberger ............ H04R 5/02 381/17

(Continued)

FOREIGN PATENT DOCUMENTS

| | | |
|---|---|---|
| GB | 1351842 | 5/1974 |
| JP | H0738987 | 2/1995 |

(Continued)

OTHER PUBLICATIONS

Japanese Office Action with English Language Translation, dated Oct. 3, 2016, Japanese Application No. 2016-500761.

(Continued)

*Primary Examiner* — Duc Nguyen
*Assistant Examiner* — Assad Mohammed
(74) *Attorney, Agent, or Firm* — Blakely Sokoloff Taylor & Zafman LLP

(57) ABSTRACT

A system and method for driving a loudspeaker array across directivities and frequencies to maintain timbre constancy in a listening area is described. In one embodiment, a frequency independent room constant describing the listening area is determined using the directivity index of a first beam pattern, the direct-to-reverberant ratio DR at the listener's location in the listening area, and an estimated reverberation time $T_{60}$ for the listening area at a designated frequency. On the basis of this room constant, an offset may be generated for a second beam pattern. The offset describes the decibel difference between first and second beam patterns to achieve constant timbre and may be used to adjust the second beam pattern at multiple frequencies. Maintaining constant timbre improves audio quality regardless of the characteristics of the listening area and the beam patterns used to represent
(Continued)

sound program content. Other embodiments are also described.

26 Claims, 7 Drawing Sheets

(51) Int. Cl.

| | |
|---|---|
| ***H04R 29/00*** | (2006.01) |
| ***H04S 7/00*** | (2006.01) |
| ***H04R 1/40*** | (2006.01) |
| ***H04R 5/02*** | (2006.01) |
| ***H04S 3/00*** | (2006.01) |

(52) U.S. Cl.

CPC .............. *H04S 3/008* (2013.01); *H04S 7/301* (2013.01); *H04S 7/305* (2013.01); *H04S 7/307* (2013.01); *H04R 2201/401* (2013.01); *H04R 2201/403* (2013.01); *H04R 2203/12* (2013.01); *H04R 2227/007* (2013.01); *H04S 2400/01* (2013.01); *H04S 2400/15* (2013.01)

(56) References Cited

U.S. PATENT DOCUMENTS

| | | | | |
|---|---|---|---|---|
| 6,760,451 | B1 * | 7/2004 | Craven | H03G 5/005 381/59 |
| 7,684,574 | B2 | 3/2010 | Keele, Jr. et al. | |
| 7,750,229 | B2 | 7/2010 | Lindemann | |
| 2010/0104114 | A1 * | 4/2010 | Chapman | H04S 7/307 381/103 |
| 2010/0278346 | A1 | 11/2010 | Hogue et al. | |
| 2011/0058677 | A1 * | 3/2011 | Choi | H04R 5/04 381/17 |
| 2011/0091055 | A1 * | 4/2011 | Leblanc | H04S 7/301 381/303 |
| 2012/0057732 | A1 * | 3/2012 | Choi | H04S 7/303 381/303 |
| 2012/0170769 | A1 | 7/2012 | McGrath | |

FOREIGN PATENT DOCUMENTS

| | | |
|---|---|---|
| JP | 2002123262 | 4/2002 |
| WO | WO 2006/096801 A2 | 9/2006 |
| WO | WO-2012004058 | 1/2012 |

OTHER PUBLICATIONS

PCT International Preliminary Report on Patentability for PCT International Appln No. PCT/US2014/021433 mailed on Sep. 24, 2015 (7 pages).

PCT International Search Report and Written Opinion for PCT International Appln No. PCT/US2014/021433 filed on Mar. 6, 2014 (9 pages).

* cited by examiner

TIMBRE CONSTANCY ACROSS A RANGE OF DIRECTIVITIES FOR A LOUDSPEAKER

RELATED MATTERS

This application is a U.S. National Phase Application under 35 U.S.C. §371 of International Application No. PCT/US2014/021433, filed Mar. 6, 2014, which claims the benefit of the earlier filing date of U.S. provisional application No. 61/776,648, filed Mar. 11, 2013, and this application hereby incorporates herein by reference these previous patent applications.

FIELD

An embodiment of the invention relates to a system and method for driving a loudspeaker array across directivities and frequencies to maintain timbre constancy in a listening area. Other embodiments are also described.

BACKGROUND

An array-based loudspeaker has the ability to shape its output spatially into a variety of beam patterns in three-dimensional space. These beam patterns define different directivities for emitted sound (e.g., different directivity indexes). As each beam pattern used to drive the loudspeaker array changes, timbre changes with it. Timbre is the quality of a sound that distinguishes different types of sound production that otherwise match in sound loudness, pitch, and duration (e.g., the difference between voices and musical instruments). Inconsistent timbre results in variable and inconsistent sound perceived by a user/listener.

SUMMARY

An embodiment of the invention is directed to a system and method for driving a loudspeaker array across directivities and frequencies to maintain timbre constancy in a listening area. In one embodiment, a frequency independent room constant describing the listening area is determined using (1) the directivity index of a first beam pattern, (2) the direct-to-reverberant ratio DR at the listener's location in the listening area, and (3) an estimated reverberation time $T_{60}$ for the listening area. On the basis of this room constant, a frequency-dependent offset may be generated for a second beam pattern. The offset describes the decibel difference between first and second beam patterns to achieve constant timbre between the beam patterns in the listening area. For example, the level of the second beam pattern may be raised or lowered by the offset to match the level of the first beam pattern. Offset values may be calculated for each beam pattern emitted by the loudspeaker array such that the beam patterns maintain constant timbre. Maintaining constant timbre improves audio quality regardless of the characteristics of the listening area and the beam patterns used to represent sound program content.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments are described with reference to the appended drawings are now explained. While numerous details are set forth, it is understood that some embodiments of the invention may be practiced without these details. In other instances, well-known circuits, structures, and techniques have not been shown in detail so as not to obscure the understanding of this description.

Figure 1:
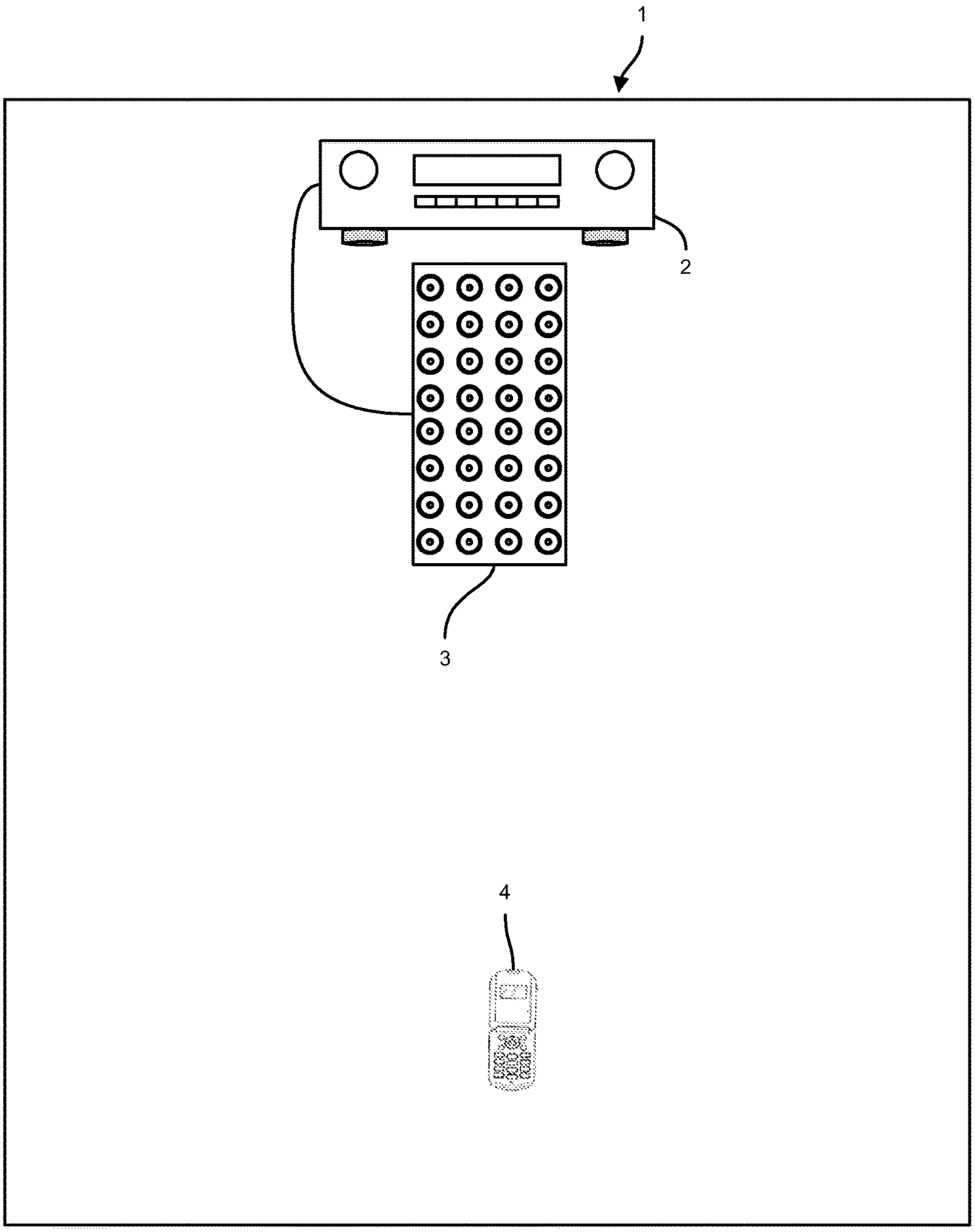
FIG. 1 shows a view of a listening area with an audio receiver, a loudspeaker array, and a listening device according to one embodiment.

FIG. 1 shows a view of a listening area 1 with an audio receiver 2, a loudspeaker array 3, and a listening device 4. The audio receiver 2 may be coupled to the loudspeaker array 3 to drive individual transducers 5 in the loudspeaker array 3 to emit various sound/beam/polar patterns into the listening area 1. The listening device 4 may sense these sounds produced by the audio receiver 2 and the loudspeaker array 3 as will be described in further detail below.

Although shown with a single loudspeaker array 3, in other embodiments multiple loudspeaker arrays 3 may be coupled to the audio receiver 2. For example, three loudspeaker arrays 3 may be positioned in the listening area 1 to respectively represent front left, front right, and front center channels of a piece of sound program content (e.g., a musical composition or an audio track for a movie) output by the audio receiver 2.

As shown in FIG. 1, the loudspeaker array 3 may include wires or conduit for connecting to the audio receiver 2. For example, the loudspeaker array 3 may include two wiring points and the audio receiver 2 may include complementary wiring points. The wiring points may be binding posts or spring clips on the back of the loudspeaker array 3 and the audio receiver 2, respectively. The wires are separately wrapped around or are otherwise coupled to respective wiring points to electrically couple the loud loudspeaker array 3 to the audio receiver 2.

In other embodiments, the loudspeaker array 3 may be coupled to the audio receiver 2 using wireless protocols such that the array 3 and the audio receiver 2 are not physically joined but maintain a radio-frequency connection. For example, the loudspeaker array 3 may include a WiFi receiver for receiving audio signals from a corresponding WiFi transmitter in the audio receiver 2. In some embodiments, the loudspeaker array 3 may include integrated amplifiers for driving the transducers 5 using the wireless audio signals received from the audio receiver 2. As noted above, the loudspeaker array 3 may be a standalone unit that includes components for signal processing and for driving each transducer 5 according to the techniques described below.

Figure 2A:
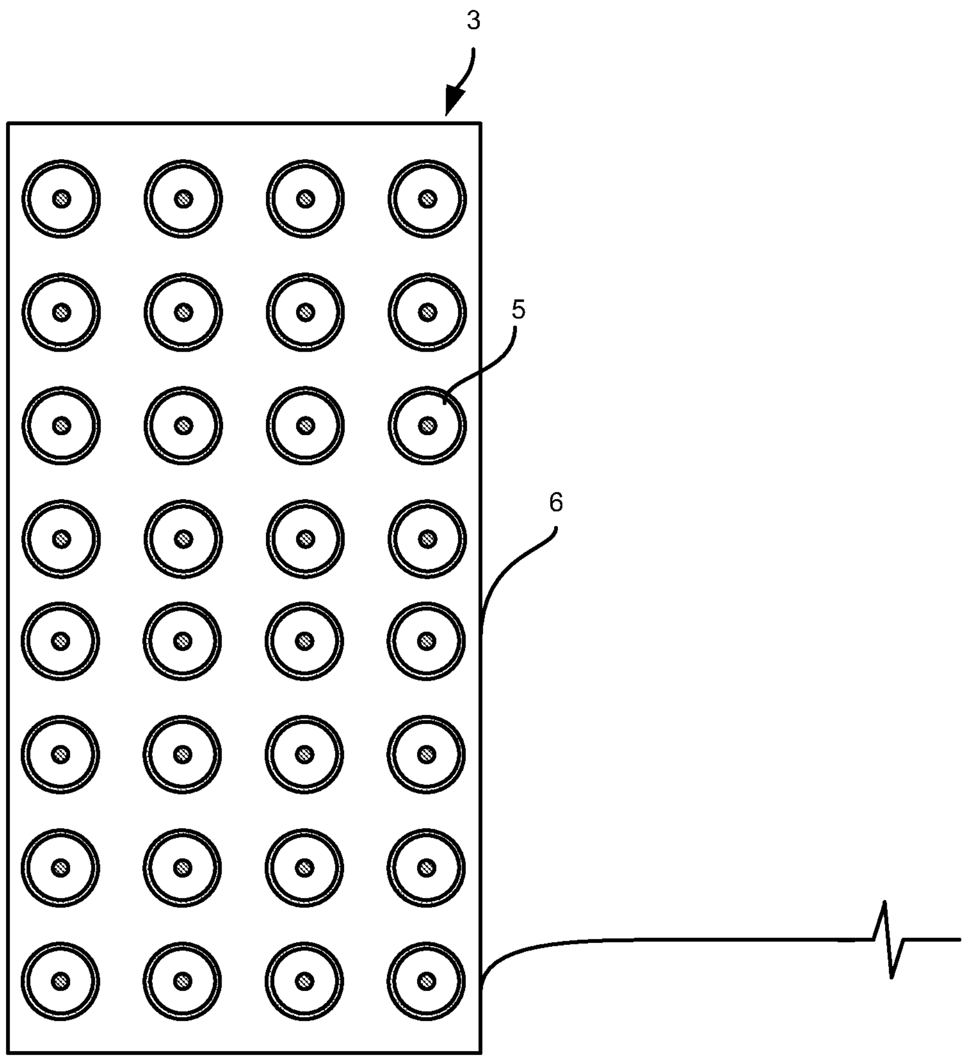
FIG. 2A shows one loudspeaker array with multiple transducers housed in a single cabinet according to one embodiment.
Figure 2B:
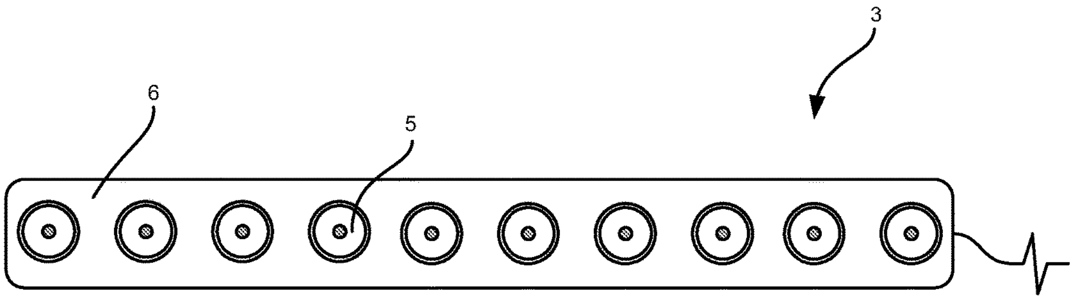
FIG. 2B shows one loudspeaker array with multiple transducers housed in a single cabinet according to another embodiment.

FIG. 2A shows one loudspeaker array 3 with multiple transducers 5 housed in a single cabinet 6. In this example, the loudspeaker array 3 has thirty-two distinct transducers 5 evenly aligned in eight rows and four columns within the cabinet 6. In other embodiments, different numbers of transducers 5 may be used with uniform or non-uniform spacing. For instance, as shown in FIG. 2B, ten transducers 5 may be aligned in a single row in the cabinet 6 to form a sound-bar style loudspeaker array 3. Although shown as aligned in a flat plane or straight line, the transducers 5 may be aligned in a curved fashion along an arc.

The transducers 5 may be any combination of full-range drivers, mid-range drivers, subwoofers, woofers, and tweeters. Each of the transducers 5 may use a lightweight diaphragm, or cone, connected to a rigid basket, or frame, via a flexible suspension that constrains a coil of wire (e.g., a voice coil) to move axially through a cylindrical magnetic gap. When an electrical audio signal is applied to the voice coil, a magnetic field is created by the electric current in the voice coil, making it a variable electromagnet. The coil and the transducers' 5 magnetic system interact, generating a mechanical force that causes the coil (and thus, the attached cone) to move back and forth, thereby reproducing sound under the control of the applied electrical audio signal coming from a source (e.g., a signal processor, a computer, and the audio receiver 2). Although described herein as having multiple transducers 5 housed in a single cabinet 6, in other embodiments the loudspeaker array 3 may include a single transducer 5 housed in the cabinet 6. In these embodiments, the loudspeaker array 3 is a standalone loudspeaker.

Figure 3:
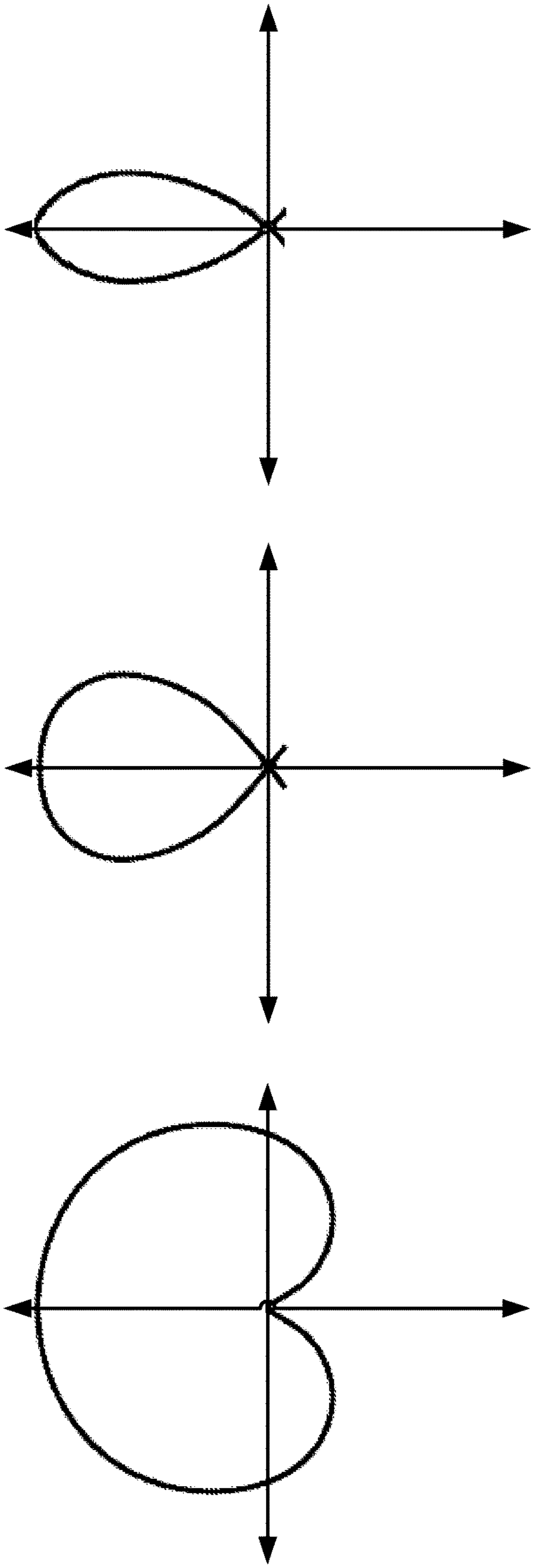
FIG. 3 shows three example polar patterns with varied directivity indexes.

Each transducer 5 may be individually and separately driven to produce sound in response to separate and discrete audio signals. By allowing the transducers 5 in the loudspeaker array 3 to be individually and separately driven according to different parameters and settings (including delays and energy levels), the loudspeaker array 3 may produce numerous sound/beam/polar patterns to simulate or better represent respective channels of sound program content played to a listener. For example, beam patterns with different directivity indexes (DI) may be emitted by the loudspeaker array 3. FIG. 3 shows three example polar patterns with varied DIs (higher DI from left-to-right). The DIs may be represented in decibels or in a linear fashion (e.g., 1, 2, 3, etc.).

As noted above, the loudspeaker array 3 emits sound into the listening area 1. The listening area 1 is a location in which the loudspeaker array 3 is located and in which a listener is positioned to listen to sound emitted by the loudspeaker array 3. For example, the listening area 1 may be a room within a house or commercial establishment or an outdoor area (e.g., an amphitheater).

Figure 4:
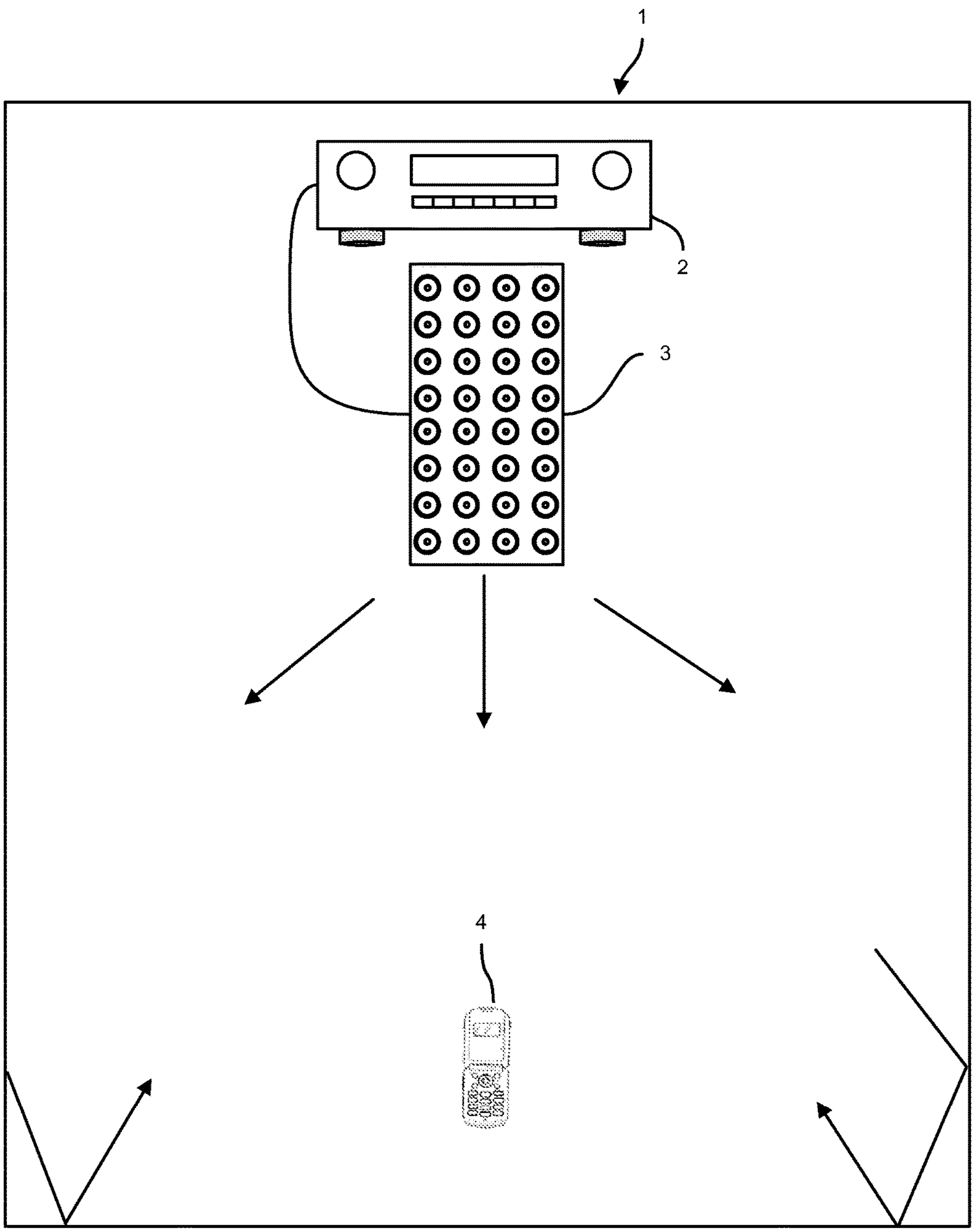
FIG. 4 shows the loudspeaker array producing direct and reflected sound in the listening area according to one embodiment.

As shown in FIG. 4, the loudspeaker array 3 may produce direct sounds and reverberant/reflected sounds in the listening area 1. The direct sounds are sounds produced by the loudspeaker array 3 that arrive at a target location (e.g., the listening device 4) without reflection off of walls, the floor, the ceiling, or other objects/surfaces in the listening area 1. In contrast, reverberant/reflected sounds are sounds produced by the loudspeaker array 3 that arrive at the target location after being reflected off of a wall, the floor, the ceiling, or another object/surface in the listening area 1. The equation below describes the pressure measured at the listening device 4 based on a summation of the multiplicity of sounds emitted by the loudspeaker array 3:

$$P^2 = G(f)\left[\frac{1}{r^2} + \frac{100\pi \cdot T_{60}(f)}{V \cdot DI(f)}\right] \qquad \text{Equation 1}$$

In the above equation, G(f) is the 1-m anechoic axial pressure squared level, r is the distance between the loudspeaker array 3 and the listening device 4, $T_{60}$ is the reverberation time in the listening area 1, V is the functional volume of the listening area 1, and DI is the directivity index of a beam pattern emitted by the loudspeaker array 3. The sound pressure may be separated into direct and reverberant components, where the direct component is defined by $$\frac{1}{r^2}$$

and the reverberant component is defined by $$\frac{100\pi \cdot T_{60}(f)}{V \cdot DI(f)}.$$

As shown and described above, the reverberant sound field is dependent on the listening area 1 properties (e.g., $T_{60}$), the DI of a beam pattern emitted by the loudspeaker array 3, and a frequency independent room constant describing the listening area 1

$$\left(\text{e.g., } \frac{V}{100\pi \cdot r^2}\right).$$

The reverberant sound field may cause changes to human-perceived timbre for an audio signal. By controlling the reverberant field for sounds produced by the loudspeaker array 3 based on the DI of an emitted beam pattern, the perceived timbre for an audio signal may also be controlled. In one embodiment, the audio receiver 2 drives the loudspeaker array 3 to maintain timbre constancy across a range of directivities and frequencies as will be further described below.

Figure 5:
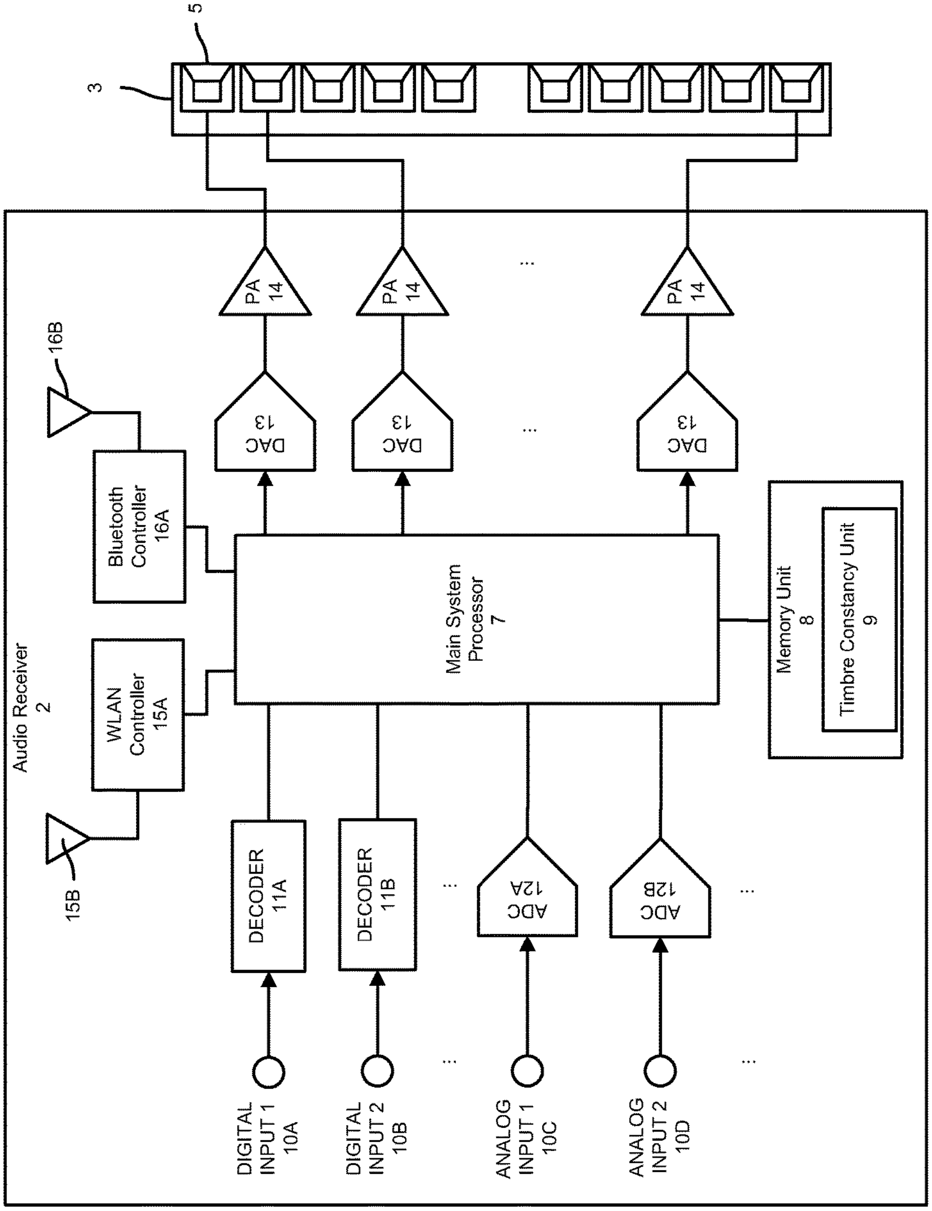
FIG. 5 shows a functional unit block diagram and some constituent hardware components of the audio receiver according to one embodiment.

FIG. 5 shows a functional unit block diagram and some constituent hardware components of the audio receiver 2 according to one embodiment. Although shown as separate, in one embodiment the audio receiver 2 is integrated within the loudspeaker array 3. The components shown in FIG. 5 are representative of elements included in the audio receiver 2 and should not be construed as precluding other components. Each element of the audio receiver 2 will be described by way of example below.

The audio receiver 2 may include a main system processor 7 and a memory unit 8. The processor 7 and the memory unit 8 are generically used here to refer to any suitable combination of programmable data processing components and data storage that conduct the operations needed to implement the various functions and operations of the audio receiver 2. The processor 7 may be a special purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines) while the memory unit 8 may refer to microelectronic, non-volatile random access memory. An operating system may be stored in the memory unit 8, along with application programs specific to the various functions of the audio receiver 2, which are to be run or executed by the processor 7 to perform the various functions of the audio receiver 2. For example, the audio receiver 2 may include a timbre constancy unit 9, which in conjunction with other hardware elements of the audio receiver 2, drive individual transducers 5 in the loudspeaker array 3 to emit various beam patterns with constant timbre.

The audio receiver 2 may include multiple inputs 10 for receiving sound program content using electrical, radio, or optical signals from an external device. The inputs 10 may be a set of digital inputs 10A and 10B and analog inputs 10C and 10D including a set of physical connectors located on an exposed surface of the audio receiver 2. For example, the inputs 10 may include a High-Definition Multimedia Interface (HDMI) input, an optical digital input (Toslink), and a coaxial digital input. In one embodiment, the audio receiver 2 receives audio signals through a wireless connection with an external device. In this embodiment, the inputs 10 include a wireless adapter for communicating with an external device using wireless protocols. For example, the wireless adapter may be capable of communicating using Bluetooth, IEEE 802.11x, cellular Global System for Mobile Communications (GSM), cellular Code division multiple access (CDMA), or Long Term Evolution (LTE).

General signal flow from the inputs 10 will now be described. Looking first at the digital inputs 10A and 10B, upon receiving a digital audio signal through an input 10A or 10B, the audio receiver 2 uses a decoder 11A or 11B to decode the electrical, optical, or radio signals into a set of audio channels representing sound program content. For example, the decoder 11A may receive a single signal containing six audio channels (e.g., a 5.1 signal) and decode the signal into six audio channels. The decoder 11A may be capable of decoding an audio signal encoded using any codec or technique, including Advanced Audio Coding (AAC), MPEG Audio Layer II, and MPEG Audio Layer III.

Turning to the analog inputs 10C and 10D, each analog signal received by analog inputs 10C and 10D represents a single audio channel of the sound program content. Accordingly, multiple analog inputs 10C and 10D may be needed to receive each channel of sound program content. The analog audio channels may be digitized by respective analog-to-digital converters 12A and 12B to form digital audio channels.

The processor 7 receives one or more digital, decoded audio signals from the decoder 11A, the decoder 11B, the analog-to-digital converter 12A, and/or the analog-to-digital converter 12B. The processor 7 processes these signals to produce processed audio signals with different beam patterns and constant timbre as described in further detail below.

As shown in FIG. 5, the processed audio signals produced by the processor 7 are passed to one or more digital-to-analog converters 13 to produce one or more distinct analog signals. The analog signals produced by the digital-to-analog converters 13 are fed to the power amplifiers 14 to drive selected transducers 5 of the loudspeaker array 3 to produce corresponding beam patterns.

In one embodiment, the audio receiver 2 may also include a wireless local area network (WLAN) controller 15A that receives and transmits data packets from a nearby wireless router, access point, or other device, using an antenna 15B. The WLAN controller 15A may facilitate communications between the audio receiver 2 and the listening device 4 through an intermediate component (e.g., a router or a hub). In one embodiment, the audio receiver 2 may also include a Bluetooth transceiver 16A with an associated antenna 16B for communicating with the listening device 4 or another external device. The WLAN controller 15A and the Bluetooth controller 16A may be used to transfer sensed sounds from the listening device 4 to the audio receiver 2 and/or audio processing data (e.g., $T_{60}$ and DI values) from an external device to the audio receiver 2.

In one embodiment, the listening device 4 is a microphone coupled to the audio receiver 2 through a wired or wireless connection. The listening device 4 may be a dedicated microphone or a computing device with an integrated microphone (e.g., a mobile phone, a tablet computer, a laptop computer, or a desktop computer). As will be described in further detail below, the listening device 4 may be used for facilitating measurements in the listening area 1.

Figure 6:
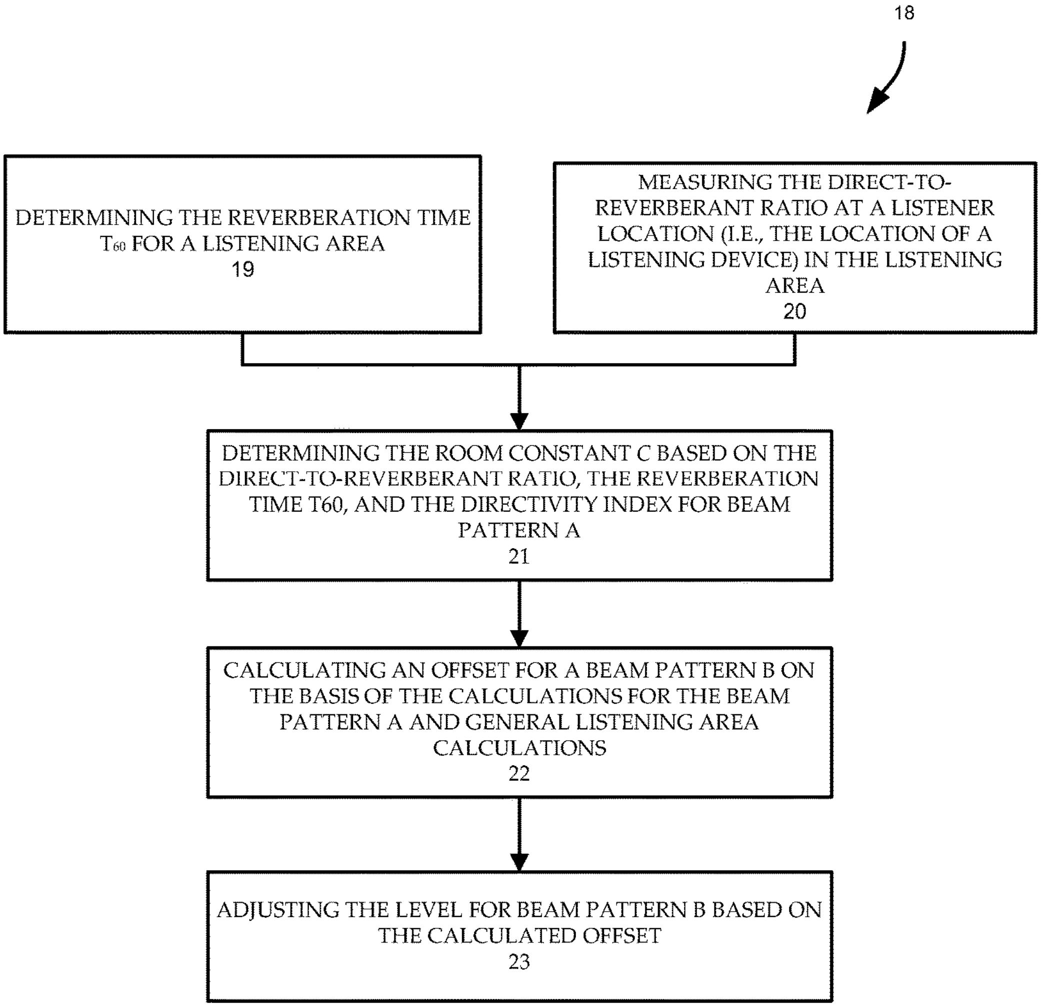
FIG. 6 shows a method for maintaining timbre constancy for the loudspeaker array across a range of directivities and frequencies according to one embodiment.

FIG. 6 shows a method 18 for maintaining timbre constancy for the loudspeaker array 3 across a range of directivities and frequencies. The method may be performed by one or more components of the audio receiver 2 and the listening device 4. For example, the method 18 may be performed by the timbre constancy unit 9 running on the processor 7.

The method 18 begins at operation 19 with the audio receiver 2 determining the reverberation time $T_{60}$ for the listening area 1. The reverberation time $T_{60}$ is defined as the time required for the level of sound to drop by 60 dB in the listening area 1. In one embodiment, the listening device 4 is used to measure the reverberation time $T_{60}$ in the listening area 1. The reverberation time $T_{60}$ does not need to be measured at a particular location in the listening area 1 (e.g., the location of the listener) or with any particular beam pattern. The reverberation time $T_{60}$ is a property of the listening area 1 and a function of frequency.

The reverberation time $T_{60}$ may be measured using various processes and techniques. In one embodiment, an interrupted noise technique may be used to measure the reverberation time $T_{60}$. In this technique, wide band noise is played and stopped abruptly. With a microphone (e.g., the listening device 4) and an amplifier connected to a set of constant percentage bandwidth filters such as octave band filters, followed by a set of ac-to-dc converters, which may be average or rms detectors, the decay time from the initial level down to −60 dB is measured. It may be difficult to achieve a full 60 dB of decay, and in some embodiments extrapolation from 20 dB or 30 dB of decay may be used. In one embodiment, the measurement may begin after the first 5 dB of decay, In one embodiment, a transfer function measurement may be used to measure the reverberation time $T_{60}$. In this technique, a stimulus-response system in which a test signal, such as a linear or log sine chirp, a maximum length stimulus signal, or other noise like signal, is measured simultaneously in what is being sent and what is being measured with a microphone (e.g., the listening device 4). The quotient of these two signals is the transfer function. In one embodiment, this transfer function may be made a function of frequency and time and thus is able to make high resolution measurements. The reverberation time $T_{60}$ may be derived from the transfer function. Accuracy may be improved by repeating the measurement sequentially from each of multiple loudspeakers (e.g., loudspeaker arrays 3) and each of multiple microphone locations in the listening area 1.

In another embodiment, the reverberation time $T_{60}$ may be estimated based on typical room characteristics dynamics. For example, the audio receiver 2 may receive an estimated reverberation time $T_{60}$ from an external device through the WLAN controller 15A and/or the Bluetooth controller 16A.

Following the measurement of the reverberation time $T_{60}$, operation 20 measures the direct-to-reverberant ratio (DR) at the listener location (i.e., the location of the listening device 4) in the listening area 1. The direct-to-reverberant ratio is the ratio of direct sound energy versus the amount of reverberant sound energy present at the listening location. In one embodiment, the direct-to-reverberant ratio may be represented as:

$$DR(f) = \frac{V \cdot DI(f)}{100\pi \cdot r^2 \cdot T_{60}(f)} \qquad \text{Equation 2}$$

In one embodiment, DR may be measured in multiple locations or zones in the listening area 1 and an average DR over these locations used during further calculations performed below. The direct-to-reverberant ratio measurement may be performed using a test sound with any known beam pattern and in any known frequency band. In one embodiment, the audio receiver 2 drives the loudspeaker array 3 to emit a beam pattern into the listening area 1 using beam pattern A. The listening device 4 may sense these sounds from beam pattern A and transmit the sensed sounds to the audio receiver 2 for processing. DR may be measured/calculated by comparing the early part of the incident sound, representing the direct field, with the later part of the arriving sound, representing the reflected sound. In one embodiment, operations 19 and 20 may be performed concurrently or in any order.

Following the direct-to-reverberant ratio measurement, the method 18 moves to operation 21 to determine the room constant c. As noted above, the room constant c is independent of frequency may be represented as:

$$c = \frac{V}{100\pi \cdot r^2} \qquad \text{Equation 3}$$

On the basis of equation 2, the room constant c may also be represented as:

$$c = \frac{DR(f) \cdot T_{60}(f)}{DI(f)} \qquad \text{Equation 4}$$

When calculating the frequency independent room constant c, the frequency dependent DR ratio, $T_{60}(f)$, and DI(f), are used in one measurement frequency range for best signal-to-noise ratio and accuracy.

As described above, the direct-to-reverberant ratio DR was measured in the listening area 1 for the beam pattern A at operation 20 and the reverberation time $T_{60}$ for the listening area 1 was determined/measured at operation 19. Further, the directivity index DI at frequency f for beam pattern A may be known for the loudspeaker array 3. For example, the DI may be determined through characterization of the loudspeaker array 3 in an anechoic chamber and transmitted to the audio receiver 2 through the WLAN and/or Bluetooth controllers 15A and 16A. On the basis of these three known values (i.e., DR, $T_{60}$, and DI), the room constant c for the listening area 1 may be calculated by the audio receiver 2 at operation 21 using Equation 4.

Once the room constant c has been calculated, this constant may be used across all frequencies to calculate the expected timbre offset for different beam patterns that will maintain a constant timbre perceived by the listener. In one embodiment, operation 22 calculates an offset for a beam pattern B on the basis of the calculations for the beam pattern A and the general listening area 1 calculations described above. For example, the offset for beam pattern B based on the calculations for beam pattern A may be represented as:

$$\text{Offset}_{BA}(f) = 10\log_{10}\left[\frac{1 + \frac{T_{60}(f)}{c \cdot DI_B(f)}}{1 + \frac{T_{60}(f)}{c \cdot DI_A(f)}}\right] \qquad \text{Equation 5}$$

The $\text{Offset}_{BA}$(f) describes the decibel difference between beam pattern A and beam pattern B. At operation 23, the audio receiver 2 adjusts the level of beam pattern B based on $\text{Offset}_{BA}$. For example, the audio receiver 2 may raise or lower the level of beam pattern B by the $\text{Offset}_{BA}$ to match the level of the beam pattern A.

In one example situation at a particular designated frequency f, the $T_{60}$ for the listening area 1 may be 0.4 seconds, the DI for beam pattern A may be 2 (i.e., 6 dB), the DI for beam pattern B may be 1 (i.e., 0 dB), and the room constant c may be 0.04. In this example situation, the $\text{Offset}_{BA}$ may be calculated using Equation 5 as follows:

$$\text{Offset}_{BA} = 10\log_{10}\left[\frac{1 + \frac{0.4}{0.04 \cdot 1}}{1 + \frac{0.4}{0.04 \cdot 2}}\right] = 2.63 \text{ dB}$$

Based on the above example, beam pattern B would be 2.63 dB louder than beam pattern A. To maintain a constant level between sound produced by beam pattern A and beam pattern B, beam pattern B's level will need to be turned down by 2.63 dB at operation 23. In other embodiments, the levels of beam patterns A and B may be both adjusted to match each other based on the $\text{Offset}_{BA}$.

Operations 22 and 23 may be performed for a plurality of beam patterns and frequencies to produce corresponding Offset values for each beam pattern emitted by the loudspeaker array 3 relative to beam pattern A. In one embodiment, the method 18 is performed during initialization of the audio receiver 2 and/or the loudspeaker array 3 in the listening area 1. In other embodiments, a user of the audio receiver 2 and/or the loudspeaker array 3 may manually initiate commencement of the method 18 through an input mechanism on the audio receiver 2.

On the basis of the Offset values computed for each beam pattern and set of frequency ranges, the audio receiver 2 drives the loudspeaker array 3 using sound program content received from inputs 10 to produce a set of beam patterns with constant perceived timbre. Maintaining constant timbre as described above improves audio quality regardless of the characteristics of the listening area 1 and the beam patterns used to represent sound program content.

As explained above, an embodiment of the invention may be an article of manufacture in which a machine-readable medium (such as microelectronic memory) has stored thereon instructions which program one or more data processing components (generically referred to here as a "processor") to perform the operations described above. In other embodiments, some of these operations might be performed by specific hardware components that contain hardwired logic (e.g., dedicated digital filter blocks and state machines). Those operations might alternatively be performed by any combination of programmed data processing components and fixed hardwired circuit components.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. A method for maintaining timbre constancy among beam patterns for a loudspeaker, comprising:

calculating a room constant c based on a directivity index ($DI_1$) of a first beam pattern, wherein the room constant c indicates a volume of the room and distance of a microphone from the loudspeaker;

calculating an offset for a second beam pattern based on the room constant c and a directivity index ($DI_2$) of the second beam pattern, wherein the offset indicates a level difference between levels of the first and second beam patterns; and adjusting the level of the second beam pattern to match the level of the first beam pattern based on the calculated offset at each frequency in a set of frequencies.

2. The method of claim 1, wherein calculating the room constant c comprises:

determining a direct-to-reverberant ratio (DR) produced by the loudspeaker for the first beam pattern at a designated frequency f; determining a time ($T_{60}$) required for the level of a sound in the room to drop by 60 dB at the designated frequency f; and determining the directivity index ($DI_1$) for the first beam pattern at the designated frequency f.

3. The method of claim 2, wherein the room constant c is equal to $$\frac{DR(f)\cdot T_{60}(f)}{DI_1(f)}.$$

4. The method of claim 2, wherein the DR(f) and T.sub.60 (f) values are determined using a test sound produced by the loudspeaker and sensed by the microphone in the room.

5. The method of claim 2, wherein the DR(t) and $T_{60}$(f) values are estimated values for a typical room.

6. The method of claim 2, further comprising: determining the directivity index ($DI_2$) for the second beam pattern, wherein the offset for the second beam pattern is calculated for the designated frequency f as $$10\log_{10}\left[\frac{1+\frac{T_{60}(f)}{c\cdot DI_2(f)}}{1+\frac{T_{60}(f)}{c\cdot DI_1(f)}}\right].$$

7. The method of claim 1, wherein the method is performed upon initialization of the loudspeaker in the room.

8. The method of claim 1, further comprising:

driving the loudspeaker to produce the second beam pattern to emit a piece of sound program content into the room based on the adjusted level at each frequency in the set of frequencies.

9. An audio receiver for maintaining timbre constancy among beam patterns for a loudspeaker array in a listening area, comprising:

a hardware processor;

a memory unit to store a timbre constancy unit to:

determine a room constant c for the listening area based on a directivity index ($DI_1$) of a first beam pattern emitted by the loudspeaker array;

determine an offset for a second beam pattern emitted by the loudspeaker array based on the room constant c and a directivity index ($DI_2$) of the second beam pattern; and adjust a level of the second beam pattern to match a level of the first beam pattern based on the offset at each frequency in a set of frequencies.

10. The audio receiver of claim 9, further comprising:

a microphone to sense sounds produced by the loudspeaker array in the listening area, wherein the room constant c indicates a volume of the listening area and a distance of the microphone from the loudspeaker array.

11. The audio receiver of claim 9, wherein the offset indicates level difference between the first and second beam patterns at each frequency in the set of frequencies.

12. The audio receiver of claim 11, wherein determining the room constant c comprises:

determine a direct-to-reverberant ratio (DR) produced by the loudspeaker array for the first beam pattern at a designated frequency f;

determine a time ($T_{60}$) required for a level of a sound in the listening area to drop by 60 dB at the designated frequency f; and determine the directivity index ($DI_1$) for the first beam pattern at the designated frequency f.

13. The audio receiver of claim 12, wherein the room constant c is equal to $$\frac{DR(f)\cdot T_{60}(f)}{DI_1(f)}.$$

14. The audio receiver of claim 12, wherein the DR(f) and $T_{60}$(f) values are determined using a test sound produced by the loudspeaker array and sensed by a microphone in the listening area.

15. The audio receiver of claim 12, further comprising:

a network controller to receive data from external devices, wherein the DR(f) and $T_{60}$(f) values are estimated values for a typical listening area received from an external device through the network controller.

16. The audio receiver of claim 12, wherein the timbre constancy unit further performs operations to: determine the directivity index ($DI_2$) for the second beam pattern, wherein the offset for the second beam pattern is calculated for the designated frequency f as $$10\log_{10}\left[\frac{1+\frac{T_{60}(f)}{c\cdot DI_2(f)}}{1+\frac{T_{60}(f)}{c\cdot DI_1(f)}}\right].$$

17. The audio receiver of claim 9, wherein the timbre constancy unit is activated upon initialization of the loudspeaker array in the listening area.

18. The audio receiver of claim 9, further comprising:

a plurality of power amplifiers to drive the loudspeaker array to produce the second beam pattern to emit a piece of sound program content into the listening area based on the adjusted level at each frequency in the set of frequencies.

19. An article of manufacture for maintaining timbre constancy among beam patterns for a loudspeaker, comprising:

a non-transitory machine-readable storage medium that stores instructions which, when executed by a processor in a computer, calculate a room constant c based on a directivity index ($DI_1$) of a first beam pattern, wherein the room constant c indicates volume of the room and distance of a microphone from the loudspeaker;

calculate an offset for a second beam pattern based on the room constant c and a directivity index ($DI_2$) of the second beam pattern, wherein the offset indicates a level difference between the first and second beam patterns; and adjust the level of the second beam pattern to match the level of the first beam pattern based on the calculated offset at each frequency in a set of frequencies.

20. The article of manufacture of claim 19, wherein the storage medium includes further instructions for calculating the room constant c, the further instructions to:

determine a direct-to-reverberant ratio (DR) produced by the loudspeaker for the first beam pattern at a designated frequency f;

determine a time ($T_{60}$) required for a level of a sound in the room to drop by 60 dB at the designated frequency f; and determine a directivity index ($DI_1$) for the first beam pattern at the designated frequency f.

21. The article of manufacture of claim 20, wherein the room constant c is equal to $$\frac{DR(f)\cdot T_{60}(f)}{DI_1(f)}.$$

22. The article of manufacture of claim 20, wherein the DR(f) and $T_{60}$(f) values are determined using a test sound produced by the loudspeaker and sensed by a microphone in the room.

23. The article of manufacture of claim 20, wherein the DR(f) and $T_{60}$(f) values are estimated values for a typical room.

24. The article of manufacture of claim 19, wherein the storage medium includes further instructions to:

determine the directivity index ($DI_2$) for the second beam pattern, wherein the offset for the second beam pattern is calculated for the designated frequency f as $$10\log_{10}\left[\frac{1+\frac{T_{60}(f)}{c\cdot DI_2(f)}}{1+\frac{T_{60}(f)}{c\cdot DI_1(f)}}\right].$$

25. The article of manufacture of claim 19, wherein the instructions are performed upon initialization of the loudspeaker in the room.

26. The article of manufacture of claim 19, wherein the storage medium includes further instructions to:

drive the loudspeaker to produce the second beam pattern to emit a piece of sound program content into the room based on the adjusted level at each frequency in the set of frequencies.

* * * * *